(12) United States Patent
Chen et al.

(10) Patent No.: US 7,033,897 B2
(45) Date of Patent: Apr. 25, 2006

(54) ENCAPSULATED SPACER WITH LOW DIELECTRIC CONSTANT MATERIAL TO REDUCE THE PARASITIC CAPACITANCE BETWEEN GATE AND DRAIN IN CMOS TECHNOLOGY

(75) Inventors: Yuanning Chen, Plano, TX (US); Antonio L. P. Rotondaro, Dallas, TX (US); Karen H. Kirmse, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 227 days.

(21) Appl. No.: 10/692,388

(22) Filed: Oct. 23, 2003

(65) Prior Publication Data

US 2005/0087775 A1 Apr. 28, 2005

(51) Int. Cl.
*H01L 21/336* (2006.01)
(52) U.S. Cl. ............... 438/303; 438/179; 438/585; 438/595; 257/344; 257/408
(58) Field of Classification Search ........ 438/299–303, 438/197, 585, 595; 257/344, 408
See application file for complete search history.

(56) References Cited

U.S. PATENT DOCUMENTS

| 5,498,555 | A | | 3/1996 | Lin |
| 6,121,631 | A | * | 9/2000 | Gardner et al. ............... 257/48 |
| 6,137,126 | A | | 10/2000 | Avanzino et al. |
| 6,346,467 | B1 | | 2/2002 | Chang et al. |
| 6,383,951 | B1 | | 5/2002 | Li |
| 6,392,310 | B1 | * | 5/2002 | Matsunaga .................. 257/296 |
| 6,437,377 | B1 | | 8/2002 | Ajmera et al. |
| 6,555,892 | B1 | | 4/2003 | Horstmann et al. |

* cited by examiner

*Primary Examiner*—Long Pham
*Assistant Examiner*—Wai-Sing Louie
(74) *Attorney, Agent, or Firm*—Peter K. McLarty; W. James Brady, III; Frederick J. Telecky, Jr.

(57) ABSTRACT

The present invention pertains to formation of a transistor in a manner that mitigates parasitic capacitance, thereby facilitating, inter alia, enhanced switching speeds. More particularly, a sidewall spacer formed upon a semiconductor substrate adjacent a conductive gate structure includes a material having a low dielectric constant (low-k) to mitigate parasitic capacitance between the gate structure, the sidewall spacer and a conductive drain formed within the semiconductor substrate. The low-k sidewall spacer is encapsulated within a nitride material which is selective to etchants such that the spacer is not altered during subsequent processing. The spacer thus retains its shape and remains effective to guide dopants into desired locations within the substrate.

16 Claims, 11 Drawing Sheets

ENCAPSULATED SPACER WITH LOW DIELECTRIC CONSTANT MATERIAL TO REDUCE THE PARASITIC CAPACITANCE BETWEEN GATE AND DRAIN IN CMOS TECHNOLOGY

FIELD OF INVENTION

The present invention relates generally to semiconductor processing, and more particularly to a methodology of fabricating a transistor such that a parasitic gate to drain capacitance is reduced by implementing a sidewall spacer having a low dielectric constant and encapsulating the same.

BACKGROUND OF THE INVENTION

Several trends presently exist in the semiconductor and electronics industry. Devices are continually getting smaller, faster and requiring less power. A reason for these trends is that more personal devices are being fabricated that are relatively small and portable, thereby relying on a battery as their primary supply source. For example, cellular phones, personal computing devices, and personal sound systems are devices that are in great demand in the consumer market. In addition to being smaller and more portable, personal devices are requiring more computational power and speed. In light of all these trends, there is an ever increasing demand in the industry for smaller and faster transistors used to provide the core functionality of the integrated circuits used in these devices.

Accordingly, in the semiconductor industry there is a continuing trend toward manufacturing integrated circuits (ICs) with higher densities. To achieve high densities, there has been and continues to be efforts toward scaling down dimensions (e.g., at submicron levels) on semiconductor wafers, that are generally produced from bulk silicon. In order to accomplish such high densities, smaller feature sizes, smaller separations between features, and more precise feature shapes are required in integrated circuits (ICs) fabricated on small rectangular portions of the wafer, commonly known as dies. This may include the width and spacing of interconnecting lines, spacing and diameter of contact holes, as well as the surface geometry of various other features (e.g., corners and edges). The scaling-down of integrated circuit dimensions can facilitate faster circuit performance and/or switching speeds, and can lead to higher effective yield in IC fabrication by providing more circuits on a die and/or more die per semiconductor wafer.

The process of manufacturing integrated circuits typically consists of more than a hundred steps, during which hundreds or thousands of copies of an integrated circuit can be formed on a single wafer. This process can create electrically active regions in and on the semiconductor wafer surface. In MOS transistors, for example, a gate structure containing conductive material(s) is created, that can be energized to establish an electric field within a semiconductor channel, by which current is enabled to flow between a source region and a drain region within the transistor. The source and drain regions facilitate this conductance by virtue of containing a majority of positively doped (p) or negatively doped (n) materials.

As device sizes continue to shrink, however, capacitive effects may become noticeable and/or problematic. There are a number of extrinsic and intrinsic capacitances associated with a MOS transistor. For example, ion implantation is utilized to create the conductive source and drain regions, as well as conductive source and drain extension regions in the transistor. Such implantation may also be utilized in creating the gate structure. The source, drain and extension regions are generally formed within the semiconductor substrate adjacent the gate structure. Other layers and/or features may also be formed on the semiconductor substrate adjacent the gate structure. One or more of these items and/or features may not, however, be conductive and may instead have a dielectric constant (k) that is not low.

One type of feature that is commonly formed adjacent the gate structure upon the semiconductor substrate is a sidewall spacer. Sidewall spacers are generally utilized to block dopants from being implanted into a portion of the semiconductor substrate during a source/drain implant. The spacers thus direct the implants into desired locations within the semiconductor substrate. Sidewall spacers are generally formed out of materials that do not, however, have a low dielectric constant. As such, parasitic capacitance can develop between the conductive gate structure, non conductive dielectric sidewall spacer and the conductive drain as these items can act as "plates" of a capacitor. A capacitive charge can thus build-up between these "plates" when a signal comes through the transistor. Such a charge slows down the speed, and more particularly the switching speed, of the transistor as this potential has to be discharged before the transistor can switch or toggle again. This, obviously, is deleterious to the desired operation of the transistor.

The value of such parasitic capacitance depends, among other things, upon the degree of separation between the layers or "plates" as well as the dielectric constant (k) of the material out of which the sidewall spacer separating the conductive gate structure and conductive drain is made. In particular, such capacitance increases as the distance between the plates decreases and increases as the dielectric constant of the sidewall spacer increases. Accordingly, as scaling occurs and features are shrunk and the "plates" are brought closer together, parasitic capacitance can increase. This capacitance can be maintained or reduced, however, by altering (e.g., reducing) the dielectric constant of the sidewall spacer. However, conventionally, low-k materials can not be utilized for sidewall spacers as they cannot withstand certain processing conditions. Low-k materials may not, for example, be able to withstand subsequent cleaning activities. As such, low-k spacers may become damaged during such cleaning processes, and the operation of the transistor can thereby be compromised. Similarly, low-k materials may become damaged or deformed during an etching process, rendering the low-k spacers, at least partially, ineffective to prevent dopants from being implanted into undesired locations within the substrate, and improperly or incorrectly placed implants can degrade the operation of the transistor.

Accordingly, improved techniques for fabricating densely packed semiconductor devices would be desirable. More particularly, it would be desirable to fabricate semiconductor devices in a manner that allows for low-k sidewall spacers to be utilized such that parasitic capacitances are mitigated and faster switching speeds are thereby facilitated.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention pertains to formation of a transistor in a manner that mitigates parasitic capacitance, thereby facilitating, inter alia, enhanced switching speeds. More particularly, a sidewall spacer formed upon a semiconductor substrate adjacent a conductive gate structure includes a material having a low dielectric constant (low-k) to mitigate parasitic capacitance between the gate structure, the sidewall spacer and a conductive drain formed within the semiconductor substrate. The low-k sidewall spacer is encapsulated within a nitride material which is selective with respect to the low-k material and resilient to subsequent cleansing activities such that the spacer is not altered during subsequent processing. The spacer thus retains its shape and remains effective to guide dopants into desired locations within the substrate.

According to one or more aspects of the present invention, a method of forming a transistor having a gate structure formed upon a substrate is disclosed. The method includes forming a first layer of nitride material over the gate structure as well as portions of the substrate adjacent the gate structure. A layer of material having a relatively low dielectric constant is then formed over the first nitride layer. The low dielectric constant material is patterned to form sidewall spacers adjacent the gate structure. A second layer of nitride material is then formed over the first nitride layer and the low dielectric constant sidewall spacers. The first and second nitride layers are then patterned so that the low dielectric constant sidewall spacers are encapsulated by nitride materials. Finally, portions of the substrate adjacent the gate structure are doped to form source/drain regions therein, the sidewall spacers being operative to guide dopants into select locations within the substrate.

In accordance with one or more other aspects of the present invention, a transistor is disclosed. The transistor includes a gate structure formed over a substrate and sidewall spacers formed on the substrate adjacent the gate structure. The sidewall spacers include a low dielectric constant material encapsulated by one or more nitride materials. The transistor also has source/drain regions formed within the substrate adjacent the gate structure. The sidewall spacers serve to guide dopants implanted into the substrate to form the source/drain regions into desired locations within the substrate.

According to one or more other aspects of the present invention, a method of forming a transistor having a gate structure formed upon a substrate is disclosed. The method includes forming a capping oxide layer over the gate structure and portions of the substrate adjacent the gate structure. The method also includes forming a layer of material having a relatively low dielectric constant over the capping oxide layer. The low dielectric constant material is then patterned to form low dielectric constant sidewall spacers adjacent the gate structure. A layer of nitride material is then formed over the capping oxide layer and the low dielectric constant sidewall spacers. The layer of nitride material is patterned so that the low dielectric constant sidewall spacers are encapsulated by nitride material. Finally, portions of the substrate adjacent the gate structure are doped to form source/drain regions therein with the sidewall spacers guiding dopant into select portions of the substrate.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
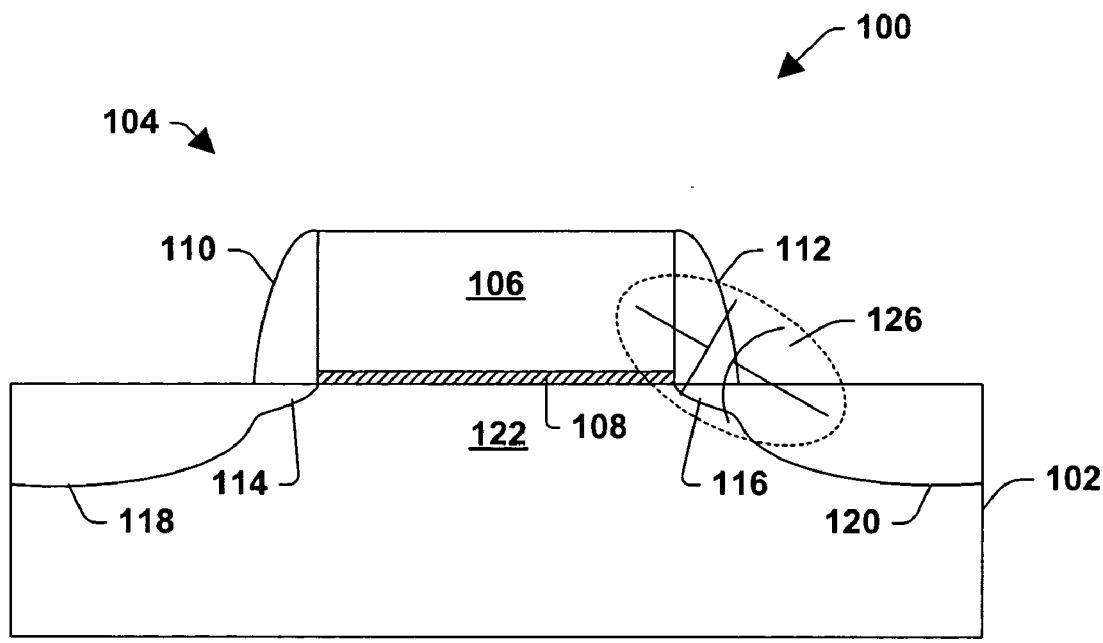
FIG. 1 is a simplified, schematic cross-sectional illustration of a conventional transistor.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

The present invention pertains to formation of a transistor in a manner that mitigates gate-to-drain parasitic capacitance, thereby facilitating, among other things, enhanced switching speeds. More particularly, a sidewall spacer formed upon a semiconductor substrate adjacent a conductive gate structure is composed of a material having a low dielectric constant (low-k) to mitigate parasitic capacitance between the gate structure, the sidewall spacer and a conductive drain formed within the semiconductor substrate. In one aspect of the invention, the low-k sidewall spacer is encapsulated within a nitride material which is selective to etchants and resistant to cleansing agents such that the spacer is not altered during subsequent processing. The spacer thus retains its shape and remains effective to guide dopants into desired locations within the substrate.

In order to appreciate various aspects of the present invention, a brief description of a conventional MOS device and fabrication process follows below. FIG. 1 illustrates a conventional semiconductor transistor device 100 that can be fabricated with conventional complimentary MOS (CMOS) processing techniques in a semiconductor substrate 102. The device 100 includes a gate structure 104 comprising a conductive gate electrode 106 and a gate dielectric 108. The gate electrode 106 generally comprises polysilicon and overlies the gate dielectric 108. Sidewall spacers 110, 112 are located upon either side of the gate structure 104. As will be discussed further, the sidewall spacers 110, 112 impede doping of certain areas or extension regions 114, 116 underlying the spacers 110, 112 during a source/drain implant. Two laterally spaced conductive source/drain regions 118 and 120 are formed within the substrate 102 via doping and a channel region 122 is defined therebetween under the gate structure 104.

In operation, the resistivity of the channel 122 may be controlled by a voltage applied to the gate electrode 106, where changing the gate voltage changes the amount of current flowing through the channel 122 between the source and drain 118, 120. The gate contact or electrode 106 and the channel 122 are separated by the gate dielectric 108, which is an insulator and which opposes current flow between the gate electrode 106 and the channel 122, such that the device does not become activated until a sufficient voltage (at least larger than a threshold voltage $V_t$) is applied to the gate electrode 106.

The sidewall spacers are generally formed out of an oxide and/or nitride material which is a dielectric not having a low dielectric constant (low-k). Such spacers typically have dielectric constants greater than seven, for example. The conventional materials for spacer normally have dielectric constant of 3.9–7. The low k materials normally have a dielectric constant less than 3.5. As such, parasitic capacitance can develop between the conductive gate electrode 106, non-conductive dielectric sidewall spacer 112 and the conductive drain 120 as these items can act as "plates" of a capacitor. A capacitive charge 126 (encircled in phantom) can thus build between these "plates" when a signal comes through the transistor. Such a charge slows down the speed, and more particularly the switching speed, of the transistor 100 as this potential has to be discharged before the transistor 100 can switch or toggle again. Thus, these layers serve as parallel plates wherein charge can build up and/or be discharged. These capacitive effects can be detrimental to the operation of the transistor 100 since switching speed is an important attribute of transistor performance.

Figure 2:
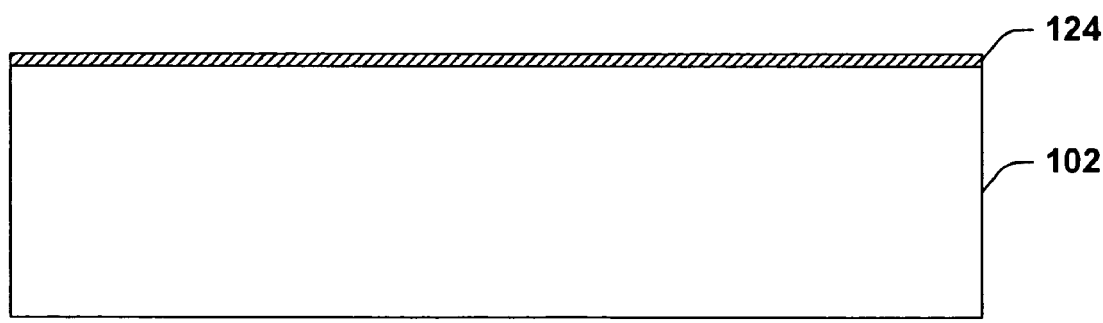
FIG. 2–8 are cross-sectional illustrations depicting a conventional methodology for forming a transistor, such as that presented in FIG. 1.
Figure 3:
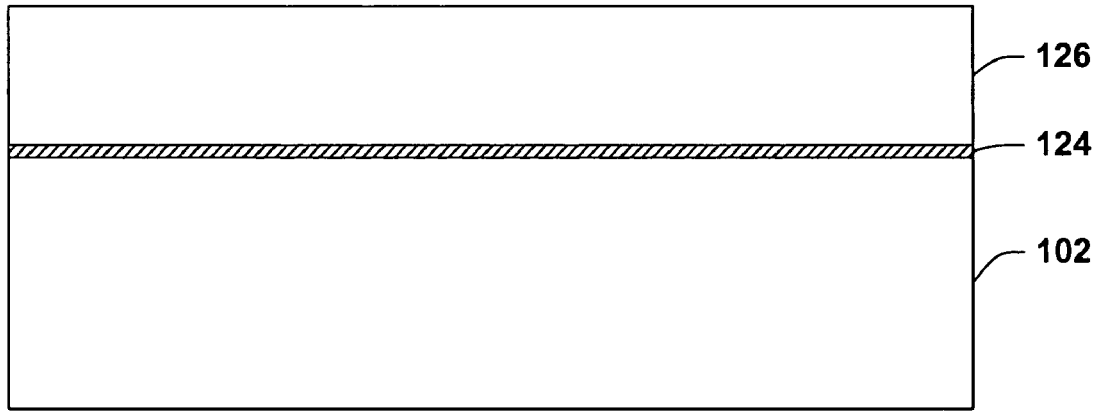
Figure 4:
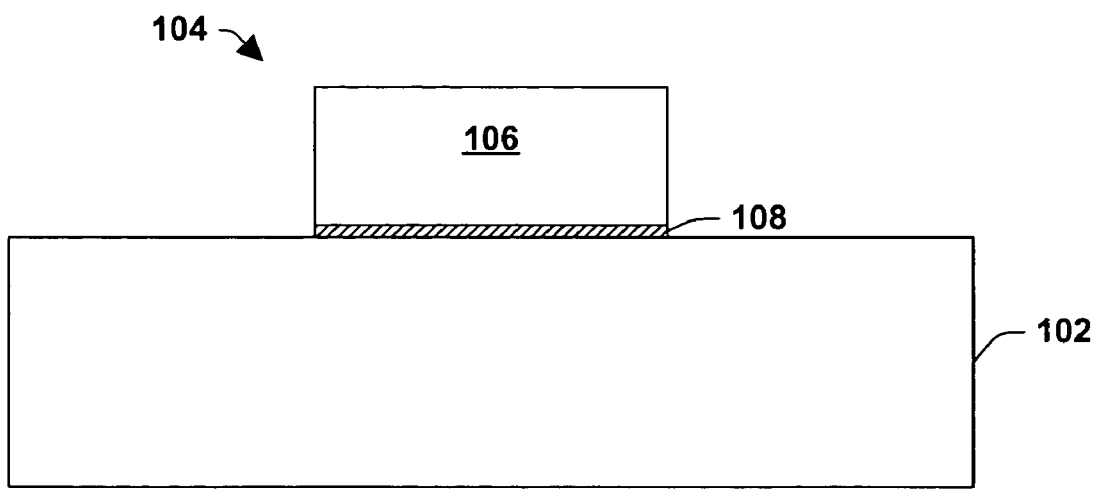
Figure 5:
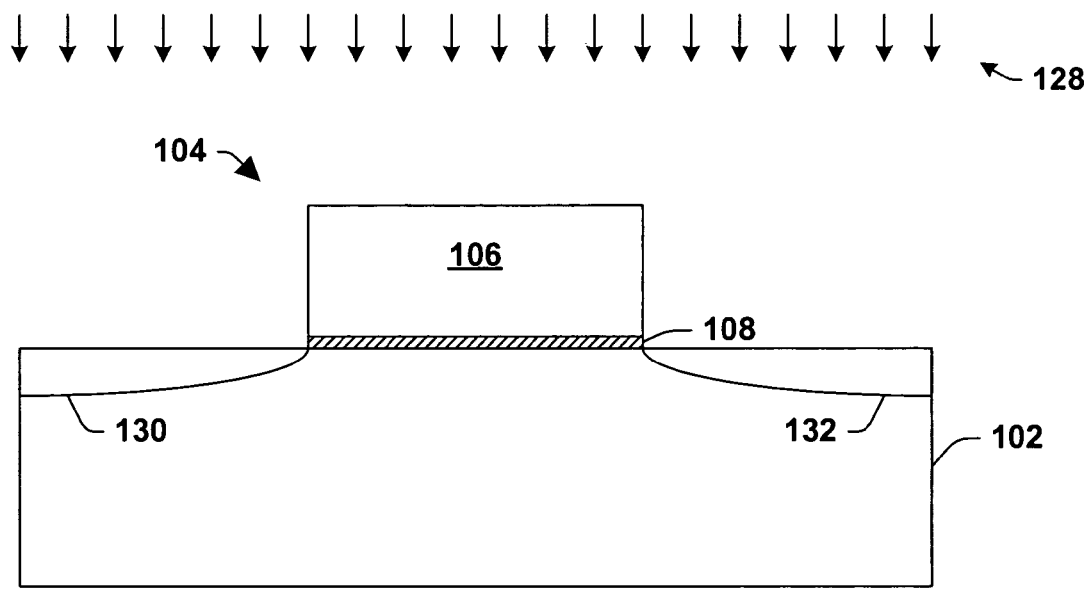

To form the device 100, a layer of dielectric material 124 such as silicon dioxide is initially formed over the substrate 102 (FIG. 2). A gate electrode layer 126 (e.g., polysilicon) is then formed over the layer of dielectric material 124 (FIG. 3). The gate electrode layer 126 and the layer of dielectric material 124 are then patterned (e.g., via etching) to develop the gate structure 104 (FIG. 4). Dopant 128 is then applied to the gate electrode 106 (e.g., via implantation) and to exposed portions of the substrate 102 to form extension regions 130, 132 therein (FIG. 5). As will become apparent, the extension regions 130, 132 are precursors to portions of the source and drain regions 118, 120 formed within the substrate 102.

Figure 6:
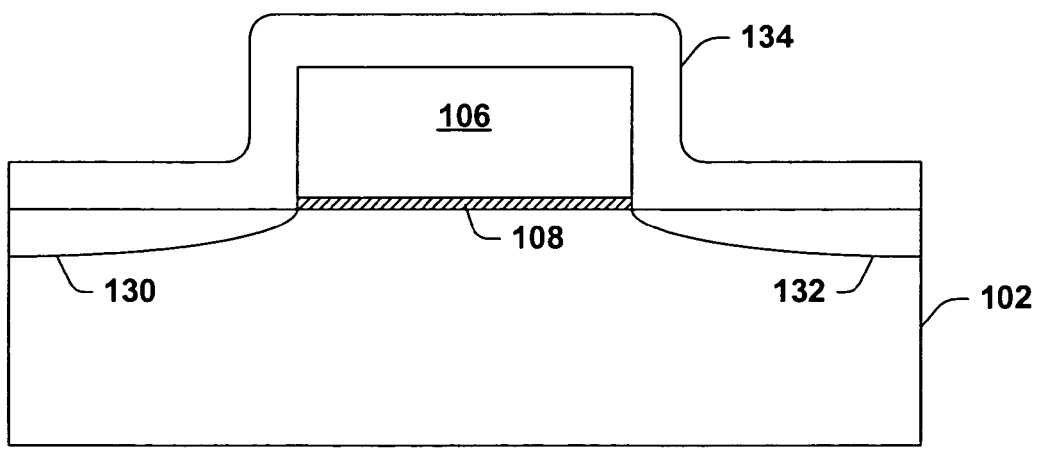
Figure 7:
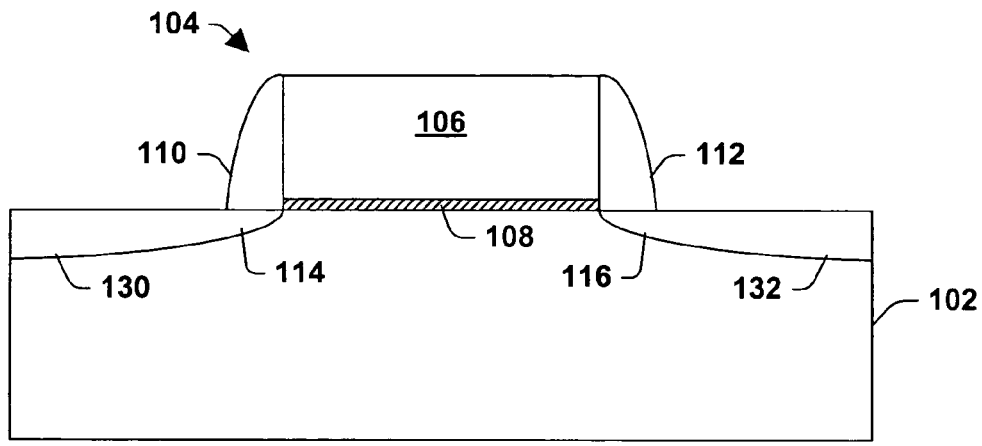
Figure 8:
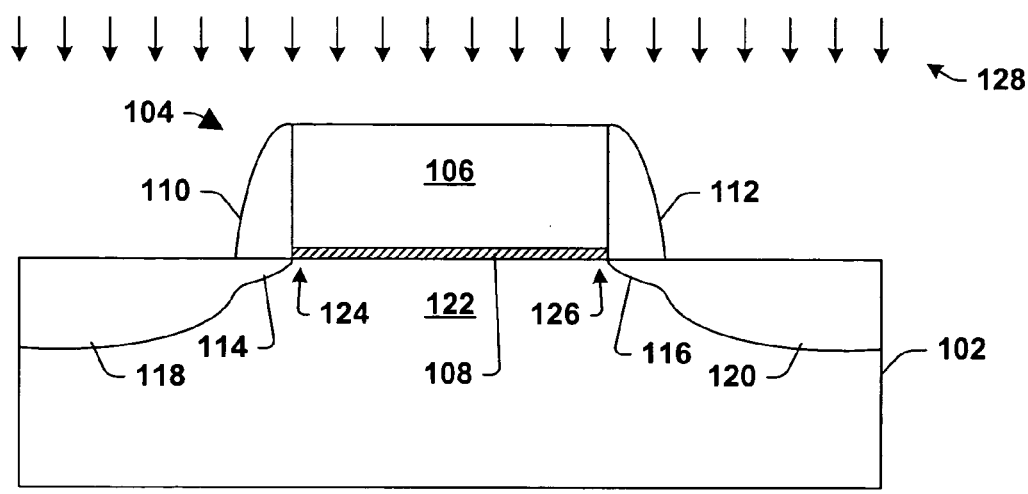

A layer of an insulating material 134 (e.g., silicon nitride, silicon oxide) is then formed over the entire structure (FIG. 6). The layer of insulating material 134 is selectively removed (e.g., via anisotropic etching) to form the sidewall spacers 110, 112 on either side of the gate structure 104 (FIG. 7). Additional dopant 128 is then applied to the gate electrode 106 and the substrate 102, except for those portions 114, 116 covered by the sidewall spacers 110, 112 (FIG. 8). The additional dopant 128 establishes the source and drain regions 118, 120 within the substrate 102 on either side of the gate structure 104. It will be appreciated that the additional dopant 128 is of substantially the same type as that previously applied in forming the extension regions 130, 132 (e.g., FIG. 5). The channel region 122 is thereby defined within the substrate 102 under the gate structure 104 as the source and drain regions 118, 120 are formed within the substrate 102 (FIG. 8).

Figure 9:
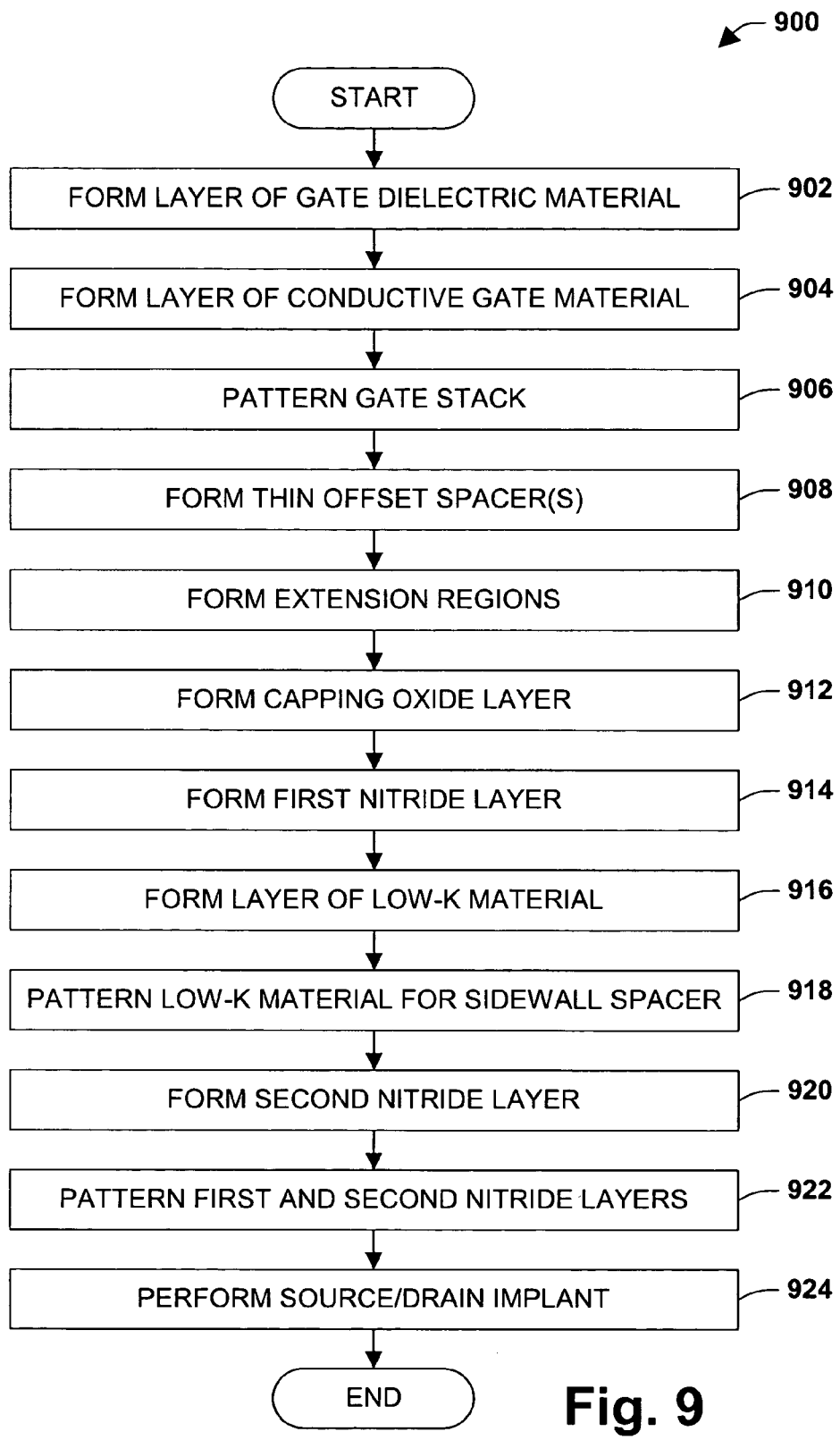
FIG. 9 is a flow diagram illustrating an example of a methodology for forming a transistor in accordance with one or more aspects of the present invention.

Turning now to FIG. 9, a methodology 900 is illustrated for forming a MOS transistor according to one or more aspects of the present invention. Although the methodology 900 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases.

It will be appreciated that a methodology carried out according to one or more aspects of the present invention may be implemented in association with the formation and/or processing of structures illustrated and described herein as well as in association with other structures not illustrated or described herein. By way of example, the method or variants thereof may be used to fabricate a transistor as illustrated and described below with respect to FIGS. 10–21, as well as to devices not shown or described herein.

Initially, a gate structure or stack is formed over a semiconductor substrate. In particular, a layer of gate dielectric material is formed over the semiconductor substrate at 902, and a layer of conductive material is then formed over the layer of dielectric material at 904. The layer of conductive material may be utilized to establish a gate electrode in the transistor, for example. Further, the conductive material may become conductive (or more conductive) via subsequent doping. Patterning is then performed upon the stack of materials to form the gate structure at 906. The gate structure thus comprises a gate electrode and a gate dielectric. It will be appreciated that the layers can be patterned in any suitable manner to form the gate structure, such as by etching, for example.

Further, the layer of gate dielectric material and the gate electrode layer can be applied to the substrate in any number of ways, such as with spin-on techniques, sputtering techniques (e.g., magnetron or ion beam sputtering), growth and/or deposition techniques such as chemical vapor deposition (CVD), for example. The gate dielectric material can be formed to a thickness of about 1 nanometer or more, and can have an equivalent oxide thickness (EOT) of about 1 nanometer or less, for example, while the gate electrode layer can be formed to a thickness of about 50–200 nm, for example.

Additionally, the substrate generally includes silicon (e.g., the substrate, an epitaxial layer, or semiconductor body region overlying an insulator in an SOI wafer), the gate electrode layer generally includes doped polysilicon, SiGe or metal, and the layer of gate dielectric material can comprise a high-k dielectric material, for example. The layer of gate dielectric material may include, for example, any one or more of the following, either alone or in combination: $SiO_2$, aluminum oxide ($Al_2O_3$), zirconium silicate, hafnium silicate, hafnium silicon oxynitride, hafnium oxynitride, zirconium oxynitride, zirconium silicon oxynitride, hafnium silicon nitride, lanthanum oxide ($La_2O_3$), hafnium oxide ($HfO_2$), zirconium oxide ($ZrO_2$), cerium oxide ($CeO_2$), bismuth silicon oxide ($Bi_4Si_2O_{12}$), titanium dioxide ($TiO_2$), tantalum oxide ($Ta_2O_5$), tungsten oxide ($WO_3$), yttrium oxide ($Y_2O_3$), lanthanum aluminum oxide ($LaAlO_3$), barium strontium titanate, barium strontium oxide, barium titanate, strontium titanate, $PbZrO_3$, PST, PZN, PZT and PMN.

At 908, one or more thin offset spacers are, for example, formed on the substrate adjacent the gate structure. The thin offset spacers, if employed, serve to guide subsequently applied dopants to desired locations within the substrate.

The offset spacers also reside over the subsequently applied dopants (e.g., from an extension region implant) should some of the dopants diffuse toward the channel as a result of annealing or other type of heat treatment, which is generally performed to activate the dopants. As such, the offset spacers mitigate dopants from underlying substantially the gate structure, which can result in (undesired) overlap capacitance. Such offset spacers may be formed to a thickness of about 9–20 nm via dry etching, for example, and may include an oxide spacer (e.g., formed in a thermal oxidation step) and/or a nitride spacer.

After the gate structure is formed, the methodology proceeds to 910 wherein source/drain extension regions are formed. Such extension regions may, for example, be formed according to HDD (highly doped drain) techniques. By way of example, a p-type dopant having a concentration of about 1 E19 to 5E20 atoms/cm$^3$ for a PMOS transistor, or an n-type dopant having concentration of about 1 E19 to 9.5E20 atoms/cm$^3$ for an NMOS transistor can be implanted to a depth of about 100–350 Angstroms, for example. It will be appreciated, however, that other implant concentrations and penetration depths are contemplated as falling within the scope of the present invention.

The methodology then proceeds to 912 where a capping oxide or cap-ox layer is formed over the entire structure. The cap-ox layer may, for example, facilitate maintaining implanted dopants within the substrate. In this manner, dopant loss is mitigated. For example, diffusion of implanted dopants up into overlying materials, such as the materials making up a sidewall spacer formed in accordance with one or more aspects of the present invention, is mitigated.

Then, at 914 a first nitride layer is formed over the cap-ox layer. The first nitride layer serves to help encapsulate a low-k sidewall spacer in accordance with one or more aspects of the present invention. A layer of low-k material is then formed over the first nitride layer at 916. The layer of low-k material may include, for example, black diamond from Applied Materials Inc. and/or coral from Novellus Systems, Inc. and/or one or more low-k materials manufactured by the JSR Microelectronics Corporation, and may have a dielectric constant of between about 2.0 and 3.5, for example.

At 918, the layer of low-k material is patterned (e.g., via dry etching, ion milling, or other suitable reduction techniques) to reveal low-k sidewall spacers adjacent to the gate structure. It is to be appreciated that the process is selective in that the first nitride layer is substantially unaffected as the layer of low-k material is processed through. The first nitride layer can, thus, serve as an etch stop to prevent further processing into underlying layers once portions of the layer of low-k material are etched. The low-k material can be dry etched with a C4F8/CO/N2/Ar chemistry in a conventional dry etch reactor such as the TEL DRM. The low-k material is etched back to such a degree that it will not be exposed when one or more subsequently applied layers formed there-over are patterned (e.g., etched) as described infra. The low-k material can, for example, be reduced so that the low-k sidewall spacers are below the interface of the first nitride layer and the capping oxide layer over the gate structure. In this manner, the low-k sidewall spacers remain substantially unaffected when the first nitride layer is subsequently etched off the top of the gate structure.

A second layer of nitride material is then formed over the entire structure at 920. The second nitride layer is also utilized in encapsulating the low-k sidewall spacer. At 922, the second and first layers of nitride material are then patterned (e.g., via dry etching, ion milling, or other suitable reduction techniques) such that remaining nitride material surrounds or encapsulates the low-k sidewall spacer. It is to be appreciated that this process is also selective in that the cap-ox layer is substantially unaffected as the first and second nitride layers are processed through. Encapsulating the low-k sidewall spacer protects it during subsequent processing. For example, subsequent etching of the cap-ox layer is selective with respect to the encapsulating nitride materials. As such, the low-k material is thereby protected and retains its dimensions, thus remaining effective to direct dopants into desired locations within the substrate, while concurrently serving to reduce gate-to-drain capacitance.

It will be appreciated that the cap-ox layer, first nitride layer, layer of low-k material and second nitride layer can be formed to respective thicknesses of between about 50 to about 500 Angstroms, for example. It is to be further appreciated that the layers can be formed in any number of suitable ways, such as with spin-on techniques, sputtering techniques (e.g., magnetron or ion beam sputtering), growth and/or deposition techniques such as chemical vapor deposition (CVD), for example.

At 924, source and drain implants are performed at relatively low energies. These implants are substantially blocked by the sidewall spacers, but are able to pass substantially undeterred through the cap-ox layer. Accordingly, source and drain regions are established within the substrate adjacent the gate structure. By way of example, a dopant of Arsenic or other suitable substance having a concentration of about 0.5 to 5E20 atoms/cm$^3$ may be implanted at an energy level of about 30 to 50 KeV to establish a source/drain to a depth of about 300–350 Angstroms, for example. The methodology may then continue for further back end processing.

Figure 10:
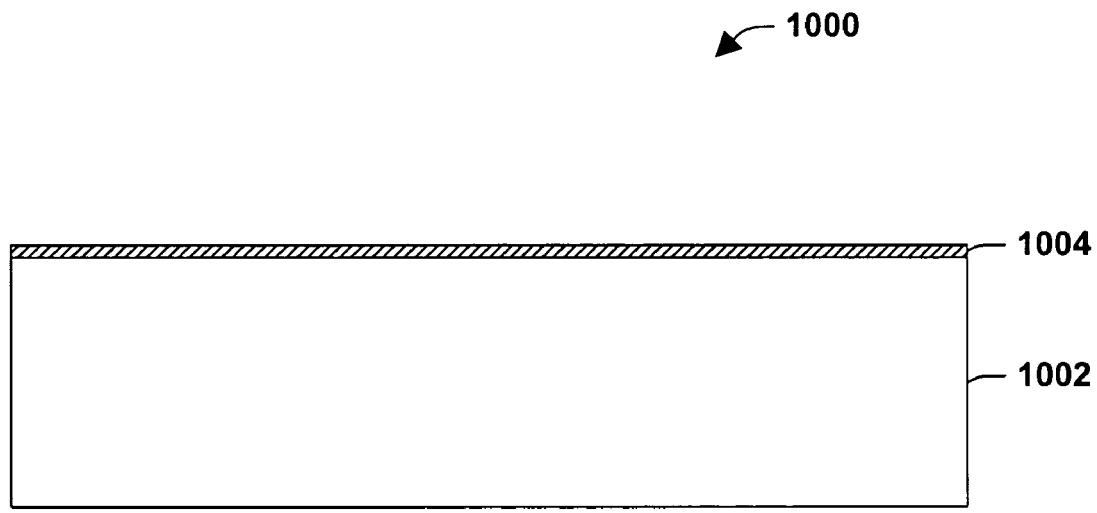
FIGS. 10–21 are cross-sectional illustrations of a transistor formed according to one or more aspects of the present invention.

Turning now to FIGS. 10–21, an exemplary technique for forming a transistor 1000 according to one or more aspects of the present invention is disclosed. Initially, a semiconductor substrate 1002 that is generally composed of silicon has a layer of gate dielectric material 1004 formed thereacross (FIG. 10). It is to be appreciated that the term "semiconductor substrate" as used herein can include a base semiconductor wafer (e.g., silicon, SiGe, or an SOI wafer) and any epitaxial layers or other type semiconductor layers formed thereover or associated therewith. It is to be further appreciated that elements depicted herein are illustrated with particular dimensions relative to one another (e.g., layer to layer dimensions and/or orientations) for purposes of simplicity and ease of understanding, and that actual dimensions of the elements may differ substantially from that illustrated herein.

The layer of gate dielectric material 1004 can include any of a number of suitable materials. Some examples include silicon dioxide, high-k materials, or a stack of such layers. It will be appreciated that the layer of gate dielectric material 1004 can be formed across the substrate 1002 in any of a number of suitable manners, including, for example, thermal growth, sputtering techniques (e.g., magnetron or ion beam sputtering), growth and/or deposition techniques, such as chemical vapor deposition (CVD). The layer of gate dielectric material can also be formed to a thickness of about 2.0 nanometers or more to mitigate "tunneling", and can have an equivalent oxide thickness (EOT) of about 2.0 nanometers or less, for example, so as to maintain and exhibit desired electrical properties. A dielectric material having a k of about 7.8 and a thickness of about 10 nm, for example, is substantially electrically equivalent to an oxide gate dielectric having a k of about 3.9 and a thickness of about 5 nm.

Figure 11:
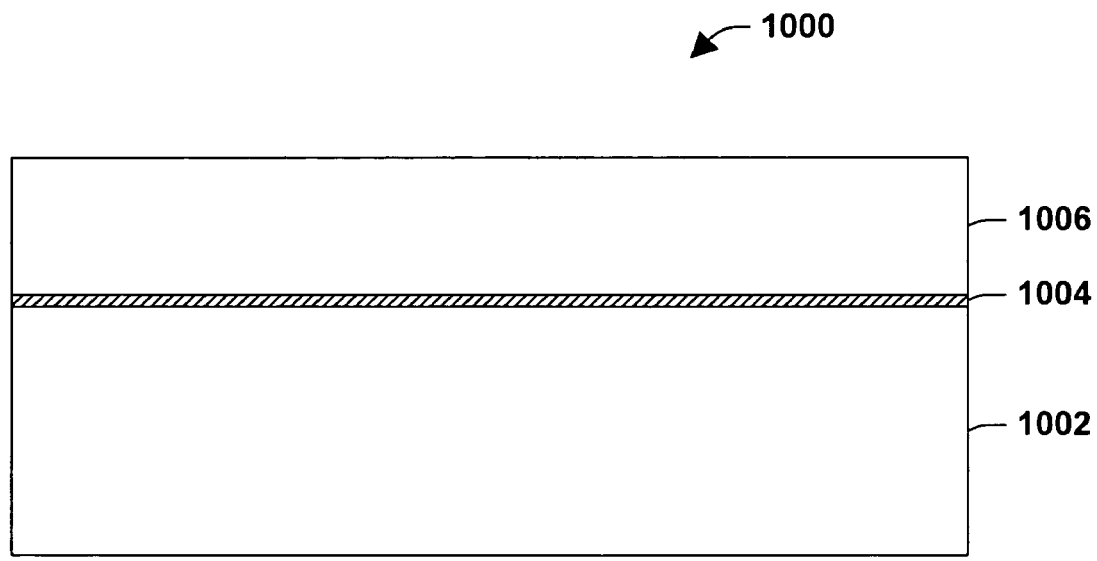

A conductive or gate electrode layer 1006 is then formed over the layer of gate dielectric material 1004 (e.g., via spin-on, sputtering, deposition, growth techniques, etc.) (FIG. 11). The gate electrode layer 1006 generally includes doped polysilicon, SiGe or metal, and can be formed to a thickness of about 200 nanometers or less, for example. The gate electrode layer 1006 ultimately yields a contact area or surface that provides a means for applying a voltage to the transistor 1000 or otherwise biasing the transistor 1000.

Figure 12:
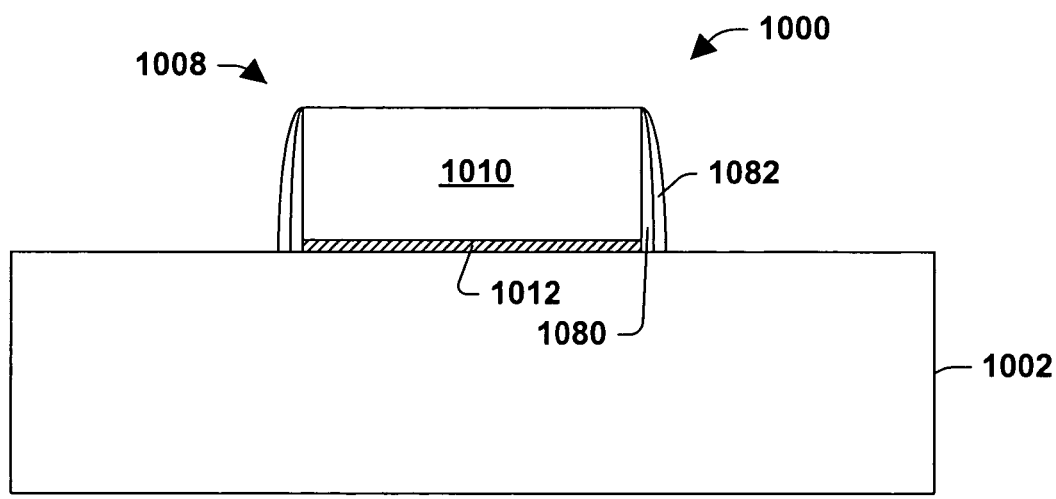

The gate electrode layer 1006 and the layer of gate dielectric material 1004 are then patterned to form a gate structure 1008 (FIG. 12). The gate structure 1008 thus comprises a gate electrode 1010 and a gate dielectric 1012. It will be appreciated that the layers can be patterned in any suitable manner(s), either alone or in combination, to form the gate structure 1008, such as by etching, for example.

One or more thin offset spacers are then formed on the substrate adjacent the gate structure 1008. The offset spacers may include an oxide spacer 1080 and/or a nitride spacer 1082, for example, and may be formed to a thickness of about 9–20 nm via dry etching, for example. The thin offset spacers serve to guide subsequently applied dopants to desired locations within the substrate 1002. The offset 1080, 1082 spacers also reside over the subsequently applied dopants should some of the dopants drift toward the channel as a result of annealing or other type of heat treatment, which is generally performed to activate the dopants. As such, the offset spacers 1080, 1082 mitigate dopants (e.g., extension regions) from underlying substantially the gate structure 1008, that can result in (undesired) overlap capacitance.

Figure 13:
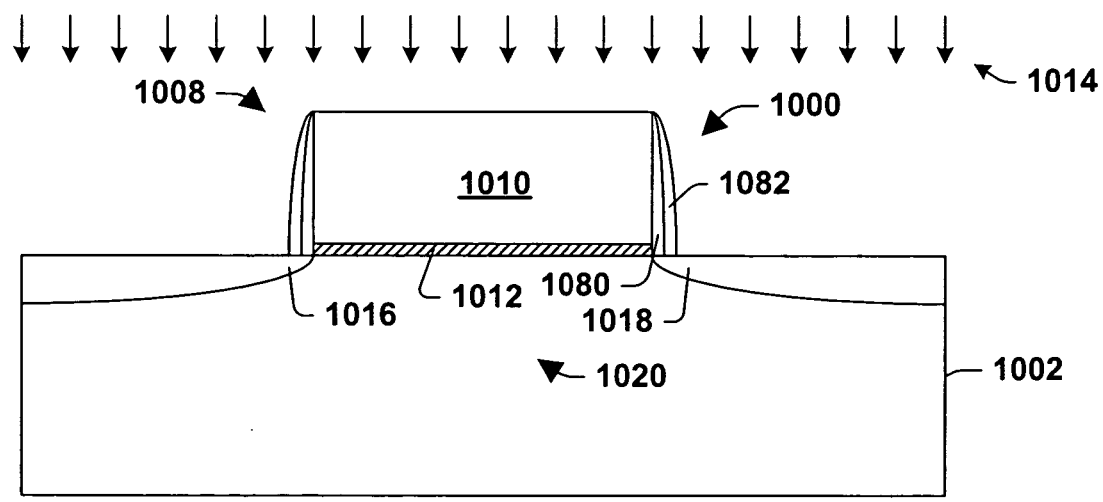
Figure 14:
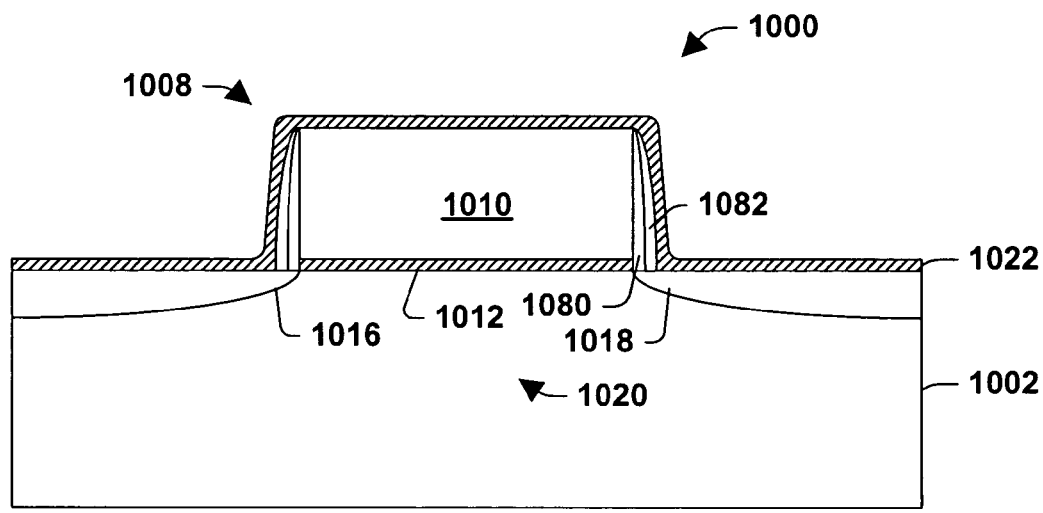

A dopant 1014 is applied to the substrate 1002 to form source and drain extension regions 1016, 1018 therein (FIG. 13). Such extension regions may, for example, be formed according to HDD (highly doped drain) techniques. The extension regions abut a channel region 1020 within the substrate 1002 under the gate structure 1008. By way of example, a p-type dopant having a concentration of about 1 E19 to 5E20 atoms/cm$^3$ for a PMOS transistor, or an n-type dopant having concentration of about 1 E19 to 9.5E20 atoms/cm$^3$ for an NMOS transistor can be implanted to a depth of about 100–350 Angstroms, for example, to establish the extension regions 1016, 1018. It will be appreciated, however, that other implant concentrations and penetration depths are contemplated as falling within the scope of the present invention.

Figure 15:
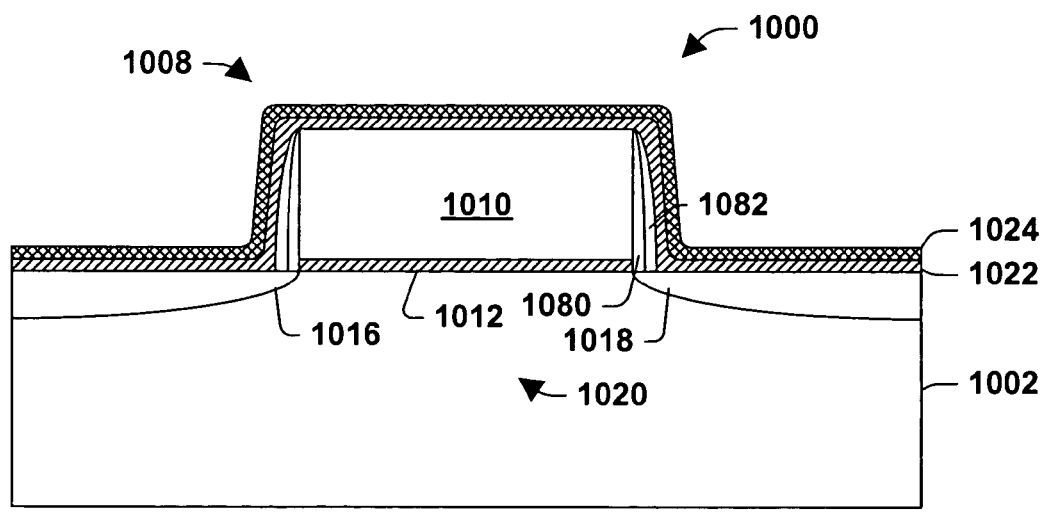
Figure 16:
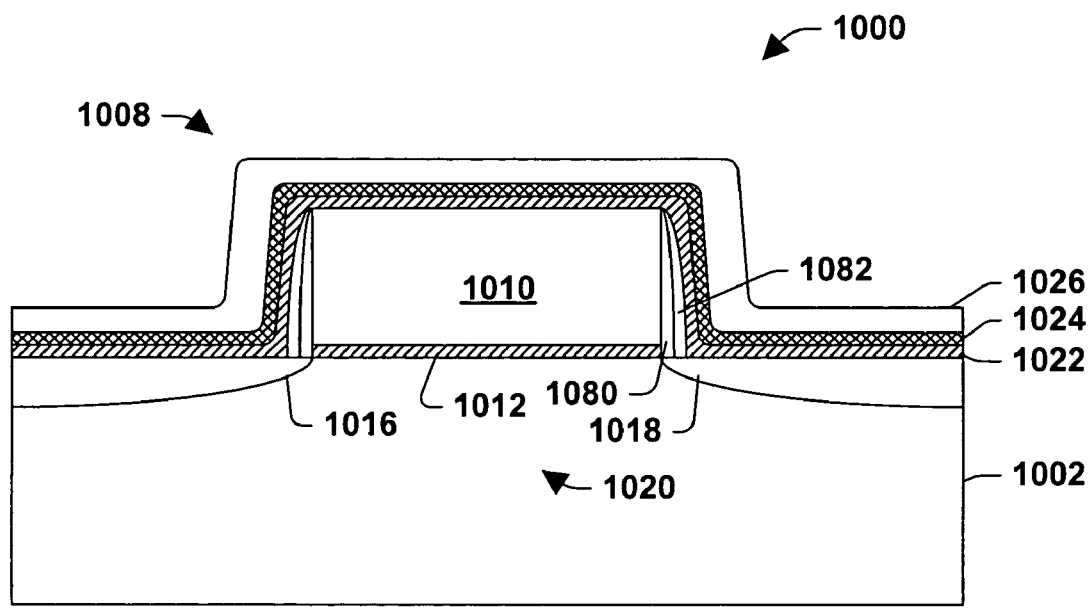

A capping oxide or cap-ox layer 1022 is then formed over the entire structure (FIG. 14), and a first nitride layer 1024 is formed over the cap-ox layer 1022 (FIG. 15). The first nitride layer 1024 serves to encapsulate a low-k sidewall spacer in accordance with one or more aspects of the present invention, as will be further appreciated below. Accordingly, a layer of low-k material 1026 is then formed over the first nitride layer 1024 (FIG. 16). The layer of low-k material 1026 may include, for example, black diamond from Applied Materials Inc. and/or coral from Novellus Systems, Inc. and/or one or more low-k materials manufactured by the JSR Microelectronics Corporation, and may have a dielectric constant of between about 2.0 and 3.5, for example.

Figure 17:
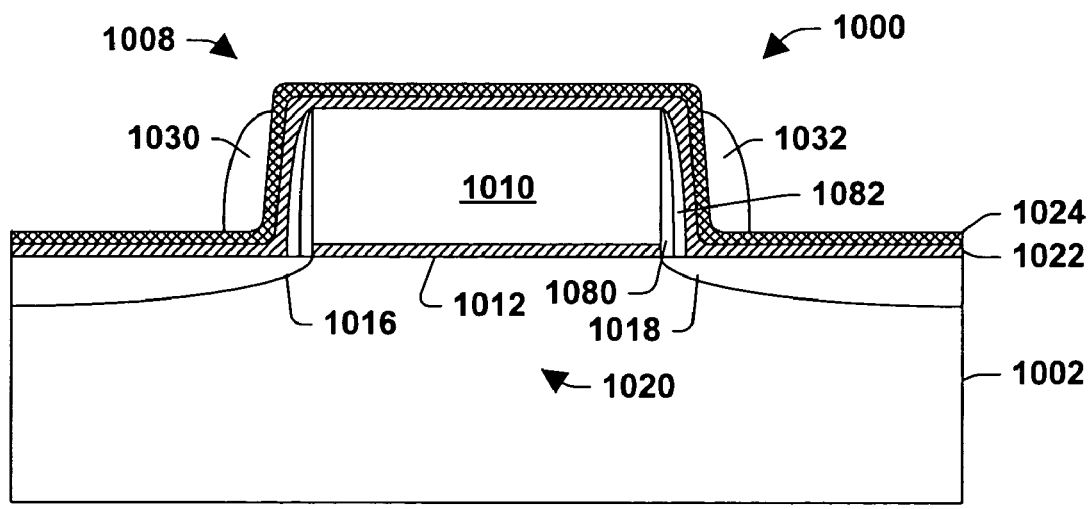

The layer of low-k material 1026 is then patterned (e.g., via dry etching, ion milling, or other suitable reduction techniques) to reveal low-k sidewall spacers 1030, 1032 adjacent to the gate structure 1008 (FIG. 17). It is to be appreciated that the process is selective in that the first nitride layer 1024 is substantially unaffected as the layer of low-k material 1026 is processed through. The first nitride layer 1024 can, thus, serve as an etch stop to prevent further processing into underlying layers once portions of the layer of low-k material 1026 are etched. It is to be further appreciated that the low-k material 1026 is etched back such that it will not be exposed when one or more subsequently applied layers that are formed there-over are patterned (e.g., etched) as described infra. In the example illustrated, for instance, the low-k material 1026 is reduced to below the interface between the capping oxide layer 1022 and the first nitride layer 1024 over the gate structure 1008. In this manner, the low-k spacers 1030, 1032 remain substantially unaffected when the first nitride layer 1024 overlying the gate structure 1008 is subsequently etched. It will be appreciated that the low-k material 1026 can be reduced further (e.g., to below the top of the gate structure 1008) to provide an even better margin.

Figure 18:
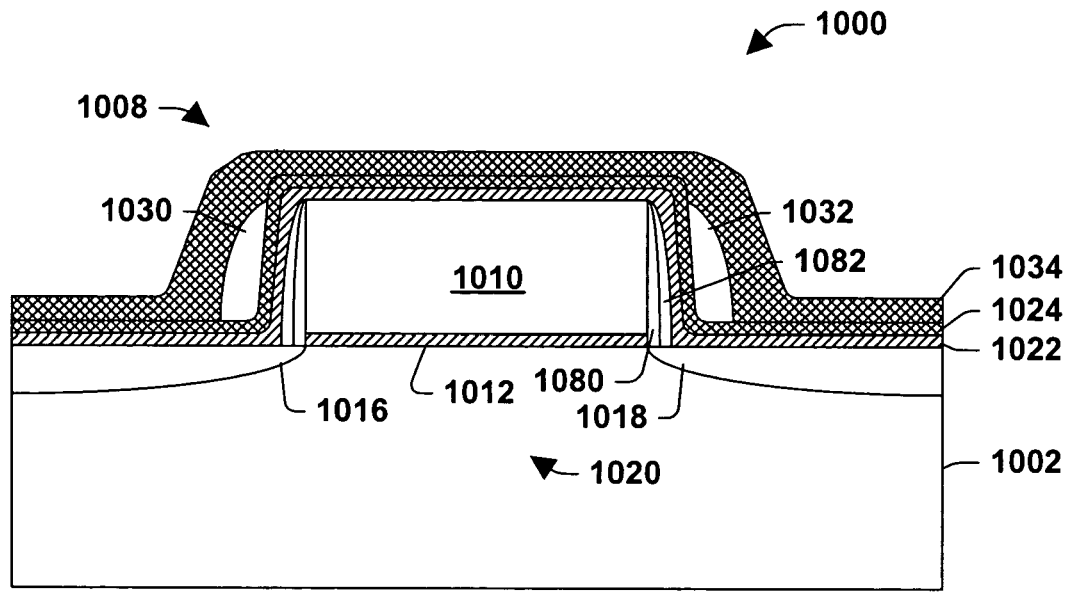
Figure 19:
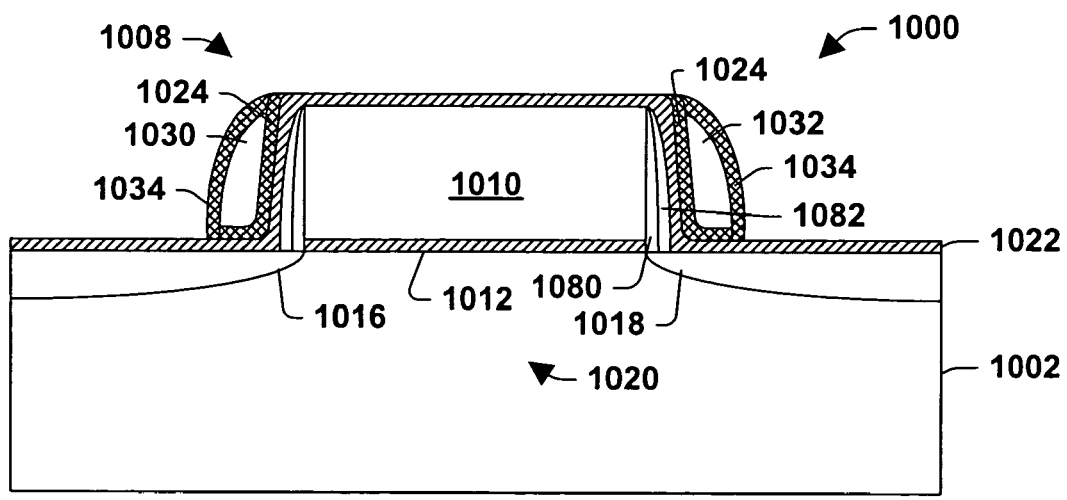

A second layer of nitride material 1034 is then formed over the entire structure (FIG. 18). The second nitride layer 1034 is also utilized in encapsulating the low-k sidewall spacer. The second 1034 and first 1024 layers of nitride material are then patterned (e.g., via dry etching, ion milling, or other suitable reduction techniques) such that remaining nitride material is left surrounding or encapsulating the low-k sidewall spacers 1030, 1032 (FIG. 19). It is to be appreciated that this process is also selective in that the cap-ox layer 1022 is substantially unaffected as the first 1024 and second 1034 nitride layers are processed through. The low-k materials can, for example, be dry etched about 3–5 times faster than oxide and nitride by using a C4F8/CO/N2/Ar chemistry. The nitride can be etched about 8–12 times faster than the cap-oxide by using a CH3F/O2 gas mixture.

It is to be appreciated, however, that at least some of the first layer of nitride material 1024 can be patterned (e.g., via dry etching, ion milling, or other suitable reduction techniques) in conjunction with the patterning of the layer of low-k material 1026. Patterning some of the first layer of nitride material 1024 with the layer of low-k material 1026 may mitigate the chances of exposing some (e.g., top portions) of the low-k spacers 1030, 1032 (e.g., during subsequent nitride patterning). Should some of the first layer of nitride material 1024 not be etched along with the layer of low-k material, for example, less nitride material will have to be etched through at some portions of the structure (e.g., above the low-k spacers 1030, 1032) while more nitride material will have to be etched through at other locations (e.g., adjacent to the low-k spacers 1030, 1032). Presuming that the etching process is performed uniformly, top portions of the low-k spacers 1030, 1032 may be more prone to exposure (as well as being subjected to additional unwanted etching).

Encapsulating the low-k sidewall spacers 1030, 1032 with the nitride materials protects the sidewall spacers 1030, 1032 during subsequent processing. For example, subsequent etching of the cap-ox layer 1022 is selective with respect to the encapsulating nitride materials 1024, 1034. Additionally, the nitride materials are not reactive with agents subsequently applied during cleansing activities. The spacers are thereby protected and retain their shape, thus remaining effective to direct dopants into desired locations within the substrate 1002.

It will be appreciated that the cap-ox layer 1022, first nitride layer 1024, layer of low-k material 1026 and second nitride layer 1034 can be formed to respective thicknesses of between about 50 to about 500 Angstroms, for example. It is also to be appreciated that in order to minimize the chance of exposure of the low-k sidewall spacers 1030, 1032 during the patterning of the second nitride layer 1034, the thickness of the second nitride layer 1034 should be greater than that of the layer of low-k material 1026, and in particular the sidewall thickness of the low-k material 1026. It is to be further appreciated that the layers can be formed in any number of suitable ways, such as with spin-on techniques, sputtering techniques (e.g., magnetron or ion beam sputtering), growth and/or deposition techniques such as chemical vapor deposition (CVD), for example.

Figure 20:
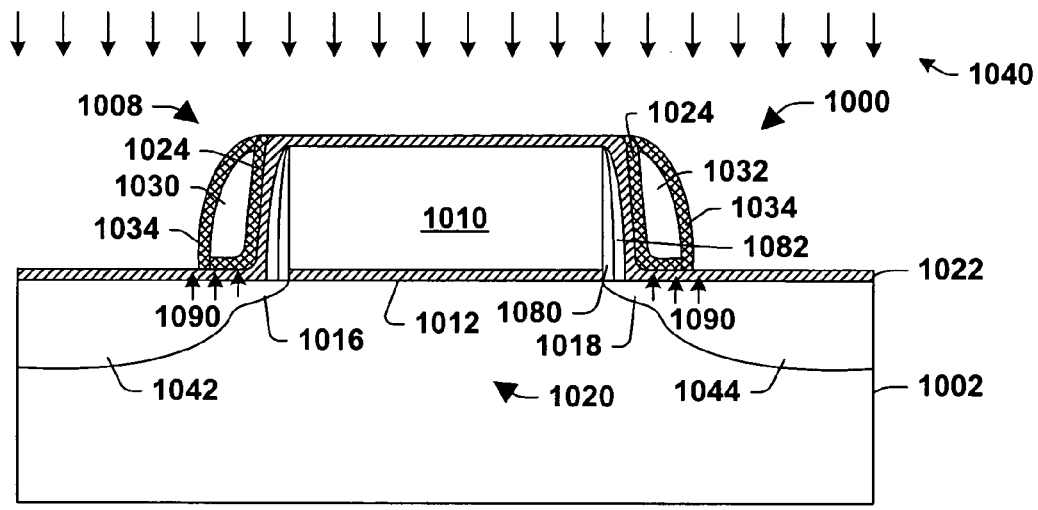

Finally, one or more additional dopants 1040 are implanted into the substrate 1002 to form source 1042 and drain 1044 regions (FIG. 20). These implants are performed at relatively low energies and are substantially blocked by the sidewall spacers, but are able to pass substantially undeterred through the cap-ox layer 1022. Accordingly, the source 1042 and drain 1044 regions are established within the substrate 1002 adjacent the gate structure 1008. By way of example, a dopant of Arsenic or other suitable substance having a concentration of about 0.5 to 5E20 atoms/cm$^3$ may be implanted at an energy level of about 30 to 50 KeV to establish the source/drain regions 1042, 1044 to a depth of about 300–350 Angstroms for forming NMOS transistors, for example. The methodology may then continue for further back end processing It will be appreciated that the cap-ox layer 1022 may be effective to maintain implanted dopants (e.g., dopants 1014 and/or 1040) within the substrate 1002, for example. In this manner, dopant loss is mitigated. For example, diffusion 1090 of implanted dopants up into overlying materials, such as the materials making up a sidewall spacer formed in accordance with one or more aspects of the present invention, is mitigated. It will be further appreciated that any differences in the height and/or other dimension(s) of the features depicted in the Figures is merely incidental and/or the result of intermediate acts that are generally understood, but that are not shown or described herein.

Figure 21:
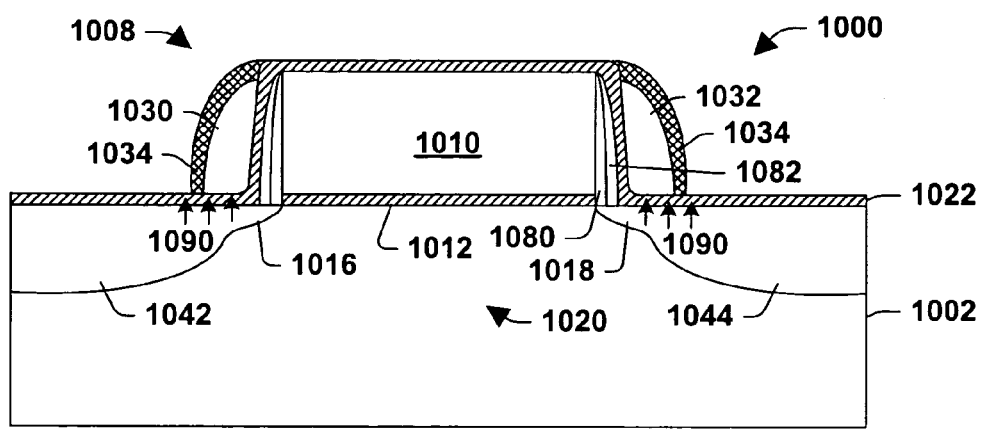

Further, given that a certain degree of etch selectivity or resistance to etchants does exist between the nitride, oxide and low-k materials, the present invention contemplates an encapsulated sidewall spacer formed without the use of a first nitride layer 1024 as described above. FIG. 21 illustrates such a transistor 1000. It will be appreciated that the low-k material may be recessed or etched back to a slightly greater degree in this arrangement to maintain its encapsulation. For example, the low-k material may be recessed so as to be substantially flush with a top surface of the gate structure 1008. In this manner, the low-k spacers 1030, 1032 will not likely be exposed when the encapsulating nitride material 1034 that is formed there-over is subsequently patterned (e.g., etched).

Accordingly, a method of forming a transistor is disclosed wherein sidewall spacers formed adjacent a conductive gate structure of the transistor include low-k materials. In this manner, parasitic capacitance between the conductive gate structure, low-k containing sidewall spacer(s) and a conductive drain region is thereby mitigated. The low-k sidewall spacers are encapsulated within a nitride material to protect the low-k materials from subsequent processing conditions, such as etchants utilized in patterning for example. The sidewall spacers thereby retain their shape and consequently their ability to direct dopants into the substrate as desired.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of forming a transistor having a gate structure formed upon a substrate, comprising:
    forming a first layer of nitride material over the gate structure and portions of the substrate adjacent the gate structure;
    forming a layer of material having a relatively low dielectric constant over the first nitride layer;
    patterning the low dielectric constant material to form low dielectric constant sidewall spacers adjacent the gate structure;
    forming a second layer of nitride material over the first nitride layer and the low dielectric constant sidewall spacers;
    patterning the first and second nitride layers so that the low dielectric constant sidewall spacers are encapsulated by nitride materials; and
    doping portions of the substrate adjacent the gate structure to form source/drain regions therein, the sidewall spacers guiding dopant into select portions of the substrate.

2. The method of claim 1, further comprising forming a capping oxide layer over the gate structure prior to forming the first layer of nitride material, wherein the capping oxide layer underlies the first nitride layer.

3. The method of claim 2, further comprising:
    forming source/drain extension regions within the substrate adjacent the gate structure prior to forming the first nitride layer.

4. The method of claim 3, further comprising forming one or more offset spacers adjacent the gate structure prior to forming the capping oxide layer, wherein the one or more thin offset spacers adjacent the gate structure substantially reduce overlap capacitance associated with the gate structure and the source/drain extension regions.

5. The method of claim 4, wherein the one or more thin offset spacers include at least one of an oxide spacer and a nitride spacer.

6. The method of claim 2, wherein the capping oxide layer mitigates loss of implanted dopants from the substrate up into overlying materials.

7. The method of claim 2, wherein implantation of dopants into the substrate to form the source/drain extension regions is substantially undeterred by the capping oxide layer.

8. The method of claim 1, wherein the low dielectric constant material has a dielectric constant of less than about 3.5.

9. The method of claim 1, wherein the low dielectric constant material includes at least one of black diamond from Applied Materials Inc., coral from Novellus Systems, Inc. and one or more low-k materials manufactured by JSR Microelectronics Corporation.

10. The method of claim 1, wherein at least one of the first nitride material, low dielectric constant material and second nitride material is formed to a thicknesses of between about 50 to about 500 Angstroms.

11. The method of claim 2, wherein the capping oxide layer is formed to a thicknesses of between about 50 to about 500 Angstroms.

12. The method of claim 1, further comprising:
   patterning at least some of the first nitride layer in conjunction with patterning the layer of low dielectric constant material.

13. The method of claim 12, wherein an etching process utilized to pattern the capping oxide layer is selective relative to the nitride materials such that the sidewall spacers are substantially unaffected by an etchant utilized in the process, the sidewall spacers thus substantially retaining their respective shapes and remaining effective to guide dopants into desired locations within the substrate.

14. The method of claim 3, wherein at least one of the source/drain extension regions are formed to a depth of about 100–350 Angstroms, forming the source/drain extension regions comprises implanting a p-type dopant having a concentration of about 1 E19 to 5E20 atoms/cm$^3$ to establish a PMOS transistor and forming the source/drain extension regions comprises implanting an n-type dopant having concentration of about 1 E19 to 9.5E20 atoms/cm$^3$ to establish an NMOS transistor.

15. A method of forming a transistor having a gate structure formed upon a substrate, comprising:
   forming a capping oxide layer over the gate structure and portions of the substrate adjacent the gate structure;
   forming a layer of material having a relatively low dielectric constant over the capping oxide layer;
   patterning the low dielectric constant material to form low dielectric constant sidewall spacers adjacent the gate structure;
   forming a layer of nitride material over the capping oxide layer and the low dielectric constant sidewall spacers;
   patterning the layer of nitride material so that the low dielectric constant sidewall spacers are encapsulated by nitride material; and
   doping portions of the substrate adjacent the gate structure to form source/drain regions therein, the sidewall spacers guiding dopant into select portions of the substrate.

16. The method of claim 15, wherein the low dielectric constant material has a dielectric constant of less than about 3.5.

* * * * *